(12) United States Patent
Lee

(10) Patent No.: US 9,530,508 B2
(45) Date of Patent: Dec. 27, 2016

(54) MEMORY DEVICE AND METHOD FOR OPERATING THE SAME

(71) Applicant: MACRONIX International Co., Ltd., Hsinchu (TW)

(72) Inventor: Ya-Jui Lee, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/558,236

(22) Filed: Dec. 2, 2014

(65) Prior Publication Data
US 2016/0155510 A1  Jun. 2, 2016

(51) Int. Cl.
| | |
|---|---|
| *G11C 16/04* | (2006.01) |
| *G11C 16/14* | (2006.01) |
| *G11C 16/26* | (2006.01) |
| *G11C 7/02* | (2006.01) |
| *G11C 7/14* | (2006.01) |
| *G11C 16/08* | (2006.01) |

(52) U.S. Cl.
CPC .............. *G11C 16/14* (2013.01); *G11C 7/02* (2013.01); *G11C 7/14* (2013.01); *G11C 16/0408* (2013.01); *G11C 16/08* (2013.01); *G11C 16/26* (2013.01)

(58) Field of Classification Search
CPC ......... G11C 16/14; G11C 16/16; G11C 16/28; G11C 11/5642
USPC ........................................ 365/185.29, 185.2
See application file for complete search history.

(56) References Cited

U.S. PATENT DOCUMENTS

| 8,879,326 B2 | 11/2014 | Hazama et al. | |
|---|---|---|---|
| 2012/0176836 A1* | 7/2012 | Iguchi | G11C 16/0483 365/185.2 |
| 2014/0064012 A1* | 3/2014 | Shin | G11C 8/12 365/230.03 |

OTHER PUBLICATIONS

"Office Action of Taiwan Counterpart Application", issued on Mar. 14, 2016, p. 1-p. 7.

* cited by examiner

*Primary Examiner* — Huan Hoang
(74) *Attorney, Agent, or Firm* — J.C. Patents

(57) ABSTRACT

A memory device and a method for operating the same are provided. The memory device includes a substrate, a plurality of word lines, and a plurality of dummy word lines. The word lines and the dummy word lines are located on the substrate. At least one side of each dummy word line is adjacent to the word line. At least one word line and at least one dummy word line form a group. The method for operating the memory device includes the following. At least one group is selected, and the group is operated. A first operational voltage is applied to the word line of the group. A second operational voltage is applied to the dummy word line of the group.

17 Claims, 2 Drawing Sheets

MEMORY DEVICE AND METHOD FOR OPERATING THE SAME

BACKGROUND OF THE INVENTION

Field of the Invention

The invention relates to a semiconductor device and a method of operating the same, and more particularly relates to a memory device and a method of operating the same.

Description of Related Art

Generally, a non-volatile memory can repeatedly perform operations of data writing, reading, and erasing and is advantageous in that the data stored therein does not disappear even when the power supply is shut down. For this reason, the non-volatile memory has been widely used as the memory device for personal computers and electronic products for maintaining normal operation when power is on.

Nevertheless, as the integrity of semiconductor devices increases, the size of each component in the memory device continues to decrease. For example, when the size of the memory cell of an NAND flash memory is reduced, the critical dimension of the sub-30 nm floating gate is also limited. In order to achieve high density and high performance, fabrication of semiconductor devices has evolved into stacking upward in the vertical direction, such that the wafer area can be used more efficiently. Therefore, semiconductor structures with a high aspect ratio are common in small-sized devices.

However, performing lithographic and etching processes for fabricating small-sized devices with a high aspect ratio is a challenge. For instance, one conductor layer near the substrate surface may be connected with the adjacent conductor layer due to incomplete etching. It may cause problems, such as slow programming, charge loss, and charge gain, when voltages are applied to the devices in the subsequent process. Hence, how to overcome the aforementioned electrical problems, caused by incomplete etching, under the limitation of the etching process is an important issue in this field.

SUMMARY OF THE INVENTION

The invention provides an operating method of a memory device for improving slow programming, charge loss, charge gain, and interference between word lines.

The invention provides an operating method of a memory device for improving a gate coupling ratio (GCR) of the memory device.

The invention provides an operating method of a memory device. The memory device includes a substrate, a plurality of word lines, and a plurality of dummy word lines. The word lines and the dummy word lines are disposed on the substrate. At least one side of each dummy word line is adjacent to the word line. At least one word line and at least one dummy word line form a group. The operating method of the memory device includes the following. At least one group is selected, and the selected group is operated. A first operational voltage is applied to the word line of the selected group. A second operational voltage is applied to the dummy word line of the selected group.

In an embodiment of the invention, when the first operational voltage is applied to the word line of the selected group, the second operational voltage is applied to the dummy word line of the selected group simultaneously.

In an embodiment of the invention, the first operational voltage and the second operational voltage are equal.

In an embodiment of the invention, the word line and the dummy word line of the selected group have the same potential.

In an embodiment of the invention, the operation includes programming, reading, or erasing.

In an embodiment of the invention, each group includes two dummy word lines and one word line, and the dummy word lines are respectively disposed on two sides of the word line.

In an embodiment of the invention, the dummy word line of each group is adjacent to the dummy word line of the adjacent group.

The invention provides a memory device that includes a substrate, a plurality of word lines, and a plurality of dummy word lines. The word lines and the dummy word lines are disposed on the substrate. At least one side of each dummy word line is adjacent to the word line. At least one word line and at least one dummy word line form a group. The word line and the dummy word line of the group have the same potential.

In an embodiment of the invention, each group includes two dummy word lines and one word line, and the dummy word lines are respectively disposed on two sides of the word line.

In an embodiment of the invention, the dummy word line of each group is adjacent to the dummy word line of the adjacent group.

In an embodiment of the invention, two adjacent groups include the same dummy word line.

In an embodiment of the invention, further includes a plurality of charge storage layers respectively disposed between each of the word lines and the substrate; and a plurality of dummy layers respectively disposed between each of the dummy word lines and the substrate.

In an embodiment of the invention, a portion of the word lines is contacted with a portion of the dummy word lines.

In an embodiment of the invention, the charge storage layers include a plurality of floating gates.

In an embodiment of the invention, a portion of the word lines is contacted with a portion of the dummy word lines.

The invention further provides a memory device that includes a substrate and a plurality of word line groups. The word line groups are disposed on the substrate. Each of the word line groups includes at least one word line and at least one dummy word line. The dummy word line is adjacent to the word line. The dummy word line and the word line have the same potential.

In an embodiment of the invention, each word line group includes two dummy word lines and one word line, and the dummy word lines are respectively disposed on two sides of the word line.

In an embodiment of the invention, a portion of the word lines is contacted with a portion of the dummy word lines of the word line group.

Based on the above, according to the operating method of the memory device provided by the invention, a plurality of groups each including at least one word line and at least one dummy word line are formed in the memory device, and the word lines and the dummy word lines in the group are applied with operational voltages simultaneously, such that the word lines and the dummy word lines of the group have the same potential. Therefore, even if the word lines or the dummy word lines in the memory device are connected due to the limitation of the etching process, the final potential of the word line does not drop due to the potential difference, so as to improve problems, such as slow programming, charge loss, charge gain, and interference between the word lines, and further to improve the gate coupling ratio and raw bit error rate (RBER) of the memory device.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1A:
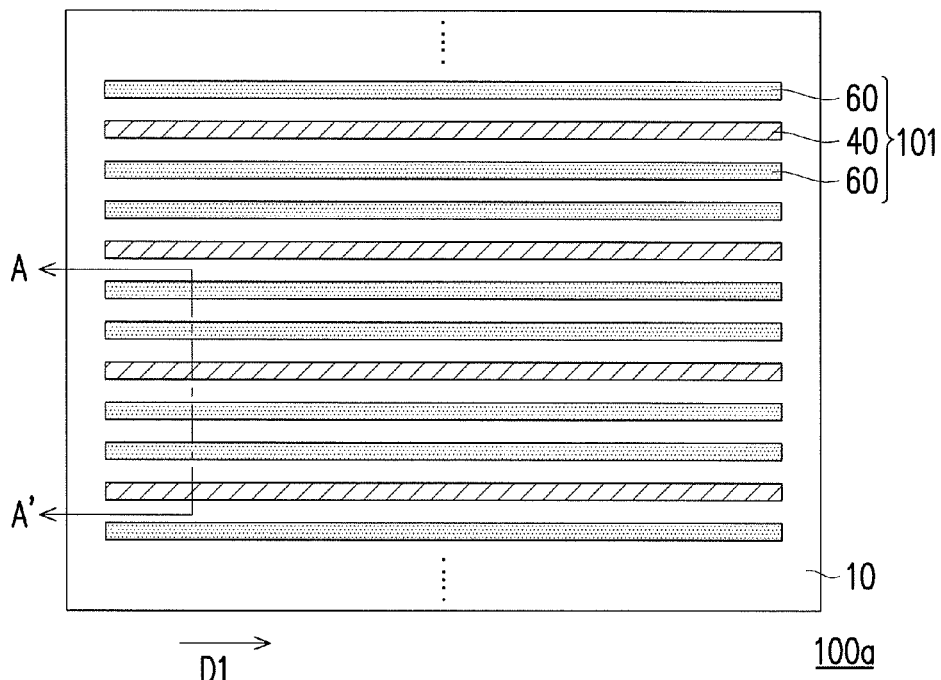
FIG. 1A is a schematic top view illustrating a memory device according to an embodiment of the invention.

FIG. 1A is a schematic top view illustrating a memory device 100a according to an embodiment of the invention.

With reference to FIG. 1A, the memory device 100a includes a substrate 10 and a plurality of groups 101. The substrate 10 is a semiconductor substrate, a semiconductor compound substrate, or a silicon on insulator (SOI) substrate, for example. The substrate 10 may include a single-layer structure or a multi-layer structure. In an embodiment, the substrate 10 is a silicon substrate, for example. The substrate 10 includes a shallow trench isolation (STI) structure therein, for example. The groups 101 are disposed on the substrate 10. The groups 101 may be arranged regularly or irregularly. In an embodiment, the groups 101 are adjacent to each other without overlapping each other. However, it should be noted that the invention is not limited thereto.

Each of the groups 101 includes at least one word line 40 and at least one dummy word line 60. The word lines 40 and the dummy word lines 60 are disposed on the substrate 10 and extend in a first direction D1. An arrangement of the word lines 40 and the dummy word lines 60 on the substrate 10 is not particularly limited. Any of the word lines 40 may be located between two other word lines 40, between two dummy word lines 60, or between another word line 40 and one of the dummy word lines 60. Likewise, any of the dummy word lines 60 may be located between two other dummy word lines 60, between two word lines 40, or between another dummy word line 60 and one of the word lines 40. In an embodiment of the invention, at least one side of each of the dummy word lines 60 is adjacent to the word line 40.

Figure 1B:
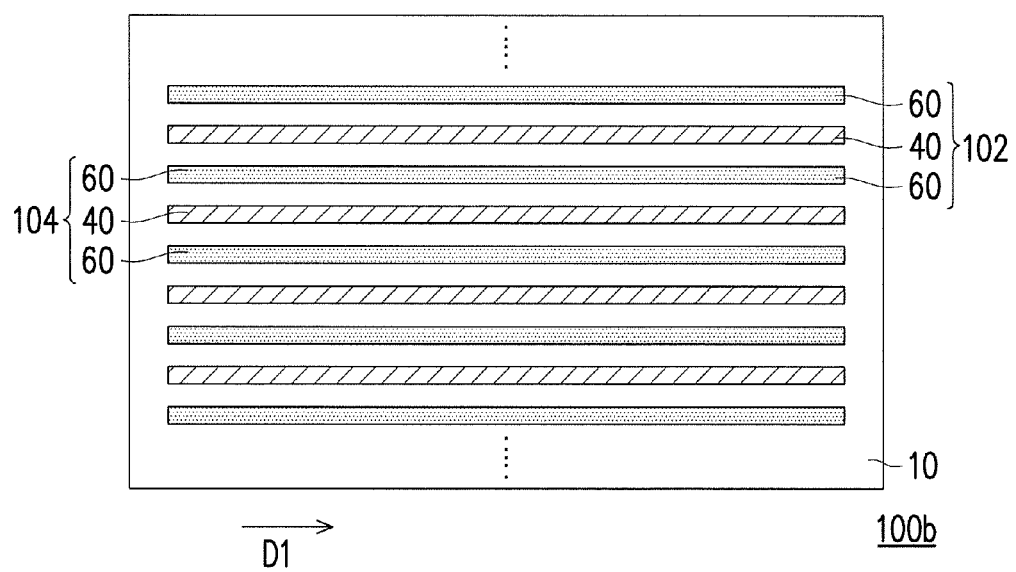
FIG. 1B is a schematic top view illustrating a memory device according to another embodiment of the invention.

The arrangement of the word lines 40 and the dummy word lines 60 on the substrate 10 is repeated on the basis of one group 101, for example. In an embodiment, each of the groups 101 includes one word line 40 and two dummy word lines 60. The dummy word lines 60 are respectively disposed on two sides of the word line 40. The dummy word line 60 of each of the groups 101 is adjacent to the dummy word line 60 of the adjacent group 101, as shown in FIG. 1A. Moreover, the dummy word line 60 of each of the groups 101 may also be adjacent to the word line 40 of the adjacent group 101, as shown in FIG. 1B. However, the invention is not limited thereto. In other embodiments, each of the groups 101 may include two or more word lines 40 and dummy word lines 60. Those skilled in the art can adjust the number of the word lines 40 and the number of the dummy word lines 60 in the group as required.

FIG. 1B is a schematic top view illustrating a memory device 100b according to another embodiment of the invention. The memory device 100b has a structure similar to the memory device 100a, for example. A difference between the memory device 100b and the memory device 100a lies in the arrangement of the word lines 40 and the dummy word lines 60 on the substrate 10.

With reference to FIG. 1B, the memory device 100b includes the substrate 10, a plurality of groups 102, and a plurality of groups 104. Each of the groups 102 and each of the groups 104 respectively include at least one word line 40 and at least one dummy word line 60. In each of the groups 102 and the groups 104, the number of the word lines 40 and the number of the dummy word lines 60 may be the same or different. In an embodiment, the groups 102 and the groups 104 are alternately arranged. However, it should be noted that the invention is not limited thereto. In another embodiment, a portion of the groups 102 and a portion of the groups 104 overlap each other. For example, the adjacent group 102 and group 104 may include the same dummy word line 60. However, it should be noted that the invention is not limited thereto. Alternatively, the adjacent group 102 and group 104 may include the same word line 40.

In an embodiment, each of the groups 102 and each of the groups 104 respectively include one word line 40 and two dummy word lines 60 that are respectively disposed on two sides of the word line 40. In this embodiment, any one of the groups 102 and the group 104 adjacent thereto include the same dummy word line 60. However, the invention is not limited thereto. In other embodiments, any one of the groups 102 and the group 104 adjacent thereto may share two or more dummy word lines 60.

Figure 2:
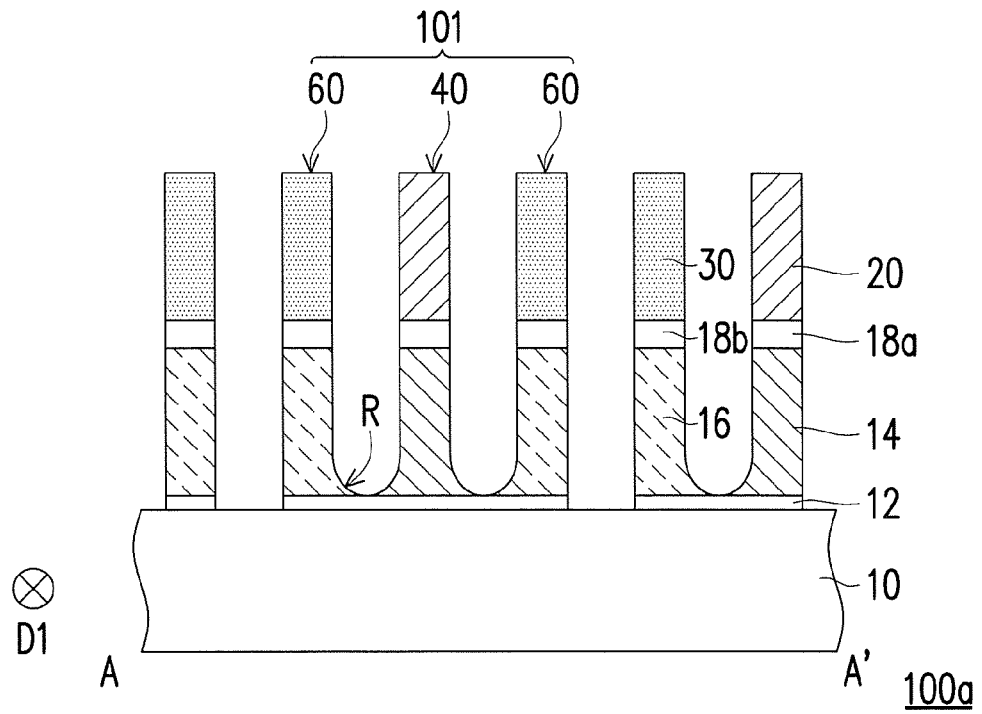
FIG. 2 is a schematic cross-sectional view along the line A-A' of FIG. 1A.

FIG. 2 is a schematic cross-sectional view along the line A-A' of FIG. 1A.

With reference to FIG. 1A and FIG. 2, in an embodiment, each of the groups 101 includes one word line 40 and two dummy word lines 60. Each word line 40 extends in the first direction D1, for example. The first direction D1 is a direction perpendicular to the paper plane of FIG. 2, for example. Each word line 40 connects a plurality of memory cells 40a in series. Each memory cell 40a includes a portion of a dielectric layer 12, a charge storage layer 14, a dielectric layer 18a, and a control gate 20. Each dummy word line 60 extends in the first direction D1, for example. Each dummy word line 60 connects a plurality of dummy memory cells 60a in series. Each dummy memory cell 60a includes a portion of the dielectric layer 12, a dummy layer 16, a dielectric layer 18b, and a dummy control gate 30.

The dielectric layer 12 is disposed on the substrate 10. A material of the dielectric layer 12 includes an oxide, a nitride, an oxynitride, or a combination of the foregoing. The material of the dielectric layer 12 is silicon oxide, for example. A method of forming the dielectric layer 12 includes performing chemical vapor deposition or thermal oxidation, for example. In an embodiment, the dielectric layer 12 serves as a tunneling dielectric layer of the memory cells.

The charge storage layer 14 is disposed on the dielectric layer 12. The charge storage layer 14 may be a conductor layer or a charge trapping dielectric layer. A material of the charge storage layer 14 includes polysilicon, doped polysilicon, silicon oxide, silicon nitride, or a combination of the foregoing. In an embodiment, the charge storage layer 14 is a floating gate, for example. The dummy layer 16 is disposed on the dielectric layer 12, and a material of the dummy layer 16 is the same as the material of the charge storage layer 14, for example. In an embodiment of the invention, the dummy layer 16 does not have a function of storing charges. A method of forming the charge storage layer 14 and the dummy layer 16 includes forming a conductor material layer (not shown) on the dielectric layer 12 and then patterning the conductor material layer to form a plurality of charge storage layers 14 and a plurality of dummy layers 16.

It should be noted that, in the process of patterning the conductor material layer, residue R may remain near the surface of the substrate 10 easily due to the limitation of the etching process. The residue R may be randomly distributed between any two charge storage layers 14, between the dummy layers 16, or between the charge storage layer 14 and the dummy layer 16, for example. This phenomenon causes a portion of the charge storage layers 14 and a portion of the dummy layers 16 to connect each other. As a result, when a single voltage is applied to the charge storage layer 14 in a subsequent process, the potential of the charge storage layer 14 may drop.

In addition, the substrate 10 on two sides of the charge storage layer 14 may further include doped regions (not shown) to serve as a source and a drain of the memory cell, for example.

With reference to FIG. 1A again, the dielectric layers 18a and 18b are respectively disposed on the charge storage layer 14 and the dummy layer 16. A material of the dielectric layers 18a and 18b includes silicon oxide, silicon nitride, silicon oxynitride, or a combination of the foregoing. Each of the dielectric layers 18a and 18b may be a single layer or a composite layer. In an embodiment, each of the dielectric layers 18a and 18b is a single-layer silicon oxide layer, for example. In another embodiment, each of the dielectric layers 18a and 18b is a composite layer of an oxide layer/a nitride layer/an oxide layer (Oxide-Nitride-Oxide, ONO), for example. A method of forming the dielectric layers 18a and 18b includes performing chemical vapor deposition or thermal oxidation, for example. In an embodiment of the invention, the dielectric layer 18a serves as an inter-gate dielectric layer of the memory cells, for example.

The control gate 20 is disposed on the dielectric layer 18a. A material of the control gate 20 includes polysilicon, doped polysilicon, metal silicide, or a combination of the foregoing. The control gate 20 extends in the first direction D1, and is contacted with a charge storage layer 14, for example. The dummy control gate 30 is disposed on the dielectric layer 18b. A material of the dummy control gate 30 is the same as the material of the control gate 20, for example. The dummy control gate 30 extends in the first direction D1 in parallel to the control gate 20, for example. In an embodiment, at least one side of each dummy control gate 30 is adjacent to the control gate 20.

According to the invention, the group 101 includes at least one word line 40 and at least one dummy word line 60. In an embodiment, the group 101 includes one word line 40 and two dummy word lines 60. The dummy word lines 60 are respectively disposed on two sides of the word line 40. The dummy word line 60 of each group 101 is adjacent to the dummy word line 60 of the adjacent group 101. Moreover, the dummy word line 60 of each group 101 may be adjacent to the word line 40 of the adjacent group 101. However, the invention is not limited thereto. In other embodiments, each of the groups 101 may include two or more word lines 40 and dummy word lines 60. Those skilled in the art can adjust the number of the word lines 40 and the number of the dummy word lines 60 in the group as required.

In addition, in an embodiment, the word lines 40 and the dummy word lines 60 may be electrically connected through a wire.

It should be noted that, when operating the memory device in a subsequent process, voltages are applied to the word lines 40 and the dummy word lines 60 of the same group 101. In an embodiment, the same voltage is applied to the word lines 40 and the dummy word lines 60 of the same group 101, such that the word lines 40 and the dummy word lines 60 have the same potential. An exemplary embodiment of operating the memory device 100a is described below as an example.

Figure 3:
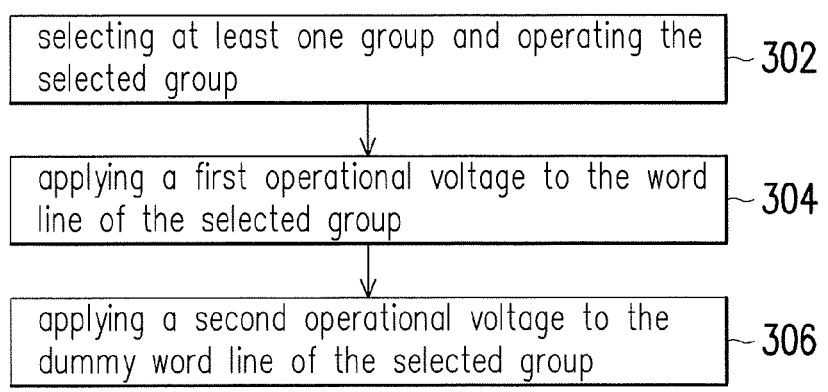
FIG. 3 is a flowchart illustrating an operating method of the memory device according to an embodiment of the invention.

FIG. 3 is a flowchart illustrating an operating method of the memory device 100a according to an embodiment of the invention.

With reference to FIG. 3, the operating method of the memory device 100a includes the following steps. In Step 302, at least one group 101 is selected, and the selected group 101 is operated. The operation on the selected group 101 includes programming, reading, or erasing. In an embodiment, one group 101 or multiple groups 101 are selected to be operated simultaneously. Next, in Step 304, a first operational voltage is applied to the word line 40 of the selected group 101, such that the word line 40 has a potential V1. Then, in Step 306, a second operational voltage is applied to the dummy word line 60 of the selected group 101, such that the dummy word line 60 has a potential V2. The first operational voltage and the second operational voltage may be a high voltage or a low voltage. The first operational voltage and the second operational voltage may be equal or unequal to each other. In an embodiment, the potential V1 of the word line 40 is the same as the potential V2 of the dummy word line 60. However, the invention is not limited to the method described above. In another embodiment, when the first operational voltage is applied to the word line 40 of the group 101, the second operational voltage is applied to the dummy word line 60 of the group 101 simultaneously, wherein the second operational voltage and the first operational voltage are the same, such that the word line 40 and the dummy word line 60 have the same potential.

When performing a programming operation on the word line 40 of the group 101, for example, the dummy word line 60 of the group 101 is simultaneously applied with the same programming voltage to cause the word line 40 and the dummy word line 60 to have the same potential. Thus, even if the charge storage layer 14 under the word line 40 is connected with the adjacent dummy layer 16 due to the residue R (as shown in FIG. 2), electrons in the charge storage layer 14 are not transferred to the adjacent dummy layer 16 through the residue R. As a result, the problem of charge loss or charge gain of the memory device 100a is prevented.

In addition, since the word line and the dummy word line adjacent thereto are applied with the operational voltages simultaneously, an interpoly dielectric layer (IPD) capacitance of the word line and the overall capacitance are changed. Even if the charge storage layer 14 under the word line is connected with the adjacent dummy layer 16 due to the residue R, the potential of the word line does not drop. Thus, in comparison with the conventional word line, the gate coupling ratio of the word line is improved. Hence, the operating method described above improves problems, such as slow programming and interference between the word lines, thereby significantly improving the raw bit error rate (RBER) of the memory device 100a.

To sum up, according to the operating method of the memory device provided by the invention, groups each including at least one word line and at least one dummy word line are formed in the memory device, and the word lines and the dummy word lines in the group are applied with operational voltages simultaneously, such that the word lines and the dummy word lines have the same potential. Therefore, even if the word lines or the dummy word lines in the memory device are connected due to the limitation of the etching process, the final potential of the word line does not drop due to the potential difference, so as to improve problems, such as slow programming, charge loss, charge gain, and interference between the word lines, and further to improve the gate coupling ratio and raw bit error rate (RBER) of the memory device.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. An operating method for operating a memory device, which comprises a substrate, a plurality of word lines, and a plurality of dummy word lines, wherein the word lines and the dummy word lines are disposed on the substrate, at least one side of each of the dummy word lines is adjacent to the word line, and two dummy word lines are respectively disposed on two sides of each of the word lines, wherein at least one word line and at least one dummy word line form a group, the operating method comprising:
   selecting at least one group and performing an operation on the selected group;
   applying a first operational voltage to the word line of the selected group; and
   applying a second operational voltage to the dummy word line of the selected group,
   wherein when the first operational voltage is applied to the word line of the selected group, the second operational voltage is applied to the dummy word line of the selected group simultaneously.

2. The operating method according to claim 1, wherein the first operational voltage and the second operational voltage are equal.

3. The operating method according to claim 1, wherein the word line and the dummy word line of the selected group have the same potential.

4. The operating method according to claim 1, wherein the operation comprises programming, reading, or erasing.

5. The operating method according to claim 1, wherein each group comprises two dummy word lines and one word line.

6. The operating method according to claim 5, wherein the dummy word line of each group is adjacent to the dummy word line of the adjacent group.

7. A memory device, comprising:
   a substrate;
   a plurality of word lines disposed on the substrate; and
   a plurality of dummy word lines disposed on the substrate, wherein at least one side of each of the dummy word lines is adjacent to the word line, and two dummy word lines are respectively disposed on two sides of each of the word lines,
   wherein at least one word line and at least one dummy word line form a group, and the word line and the dummy word line of the group have the same potential.

8. The memory device according to claim 7, wherein each group comprises two dummy word lines and one word line.

9. The memory device according to claim 8, wherein the dummy word line of each group is adjacent to the dummy word line of the adjacent group.

10. The memory device according to claim 7, wherein two adjacent groups comprise the same dummy word line.

11. The memory device according to claim 7, further comprising:
   a plurality of charge storage layers respectively disposed between each of the word lines and the substrate; and
   a plurality of dummy layers respectively disposed between each of the dummy word lines and the substrate.

12. The memory device according to claim 11, wherein a portion of the charge storage layers is contacted with a portion of the dummy layers.

13. The memory device according to claim 11, wherein the charge storage layers comprise a plurality of floating gates.

14. The memory device according to claim 7, wherein a portion of the word lines is contacted with a portion of the dummy word lines.

15. A memory device, comprising:
   a substrate; and
   a plurality of word line groups disposed on the substrate and each comprising:
   at least one word line; and
   at least one dummy word line adjacent to the at least one word line, wherein the at least one dummy word line and the at least one word line have the same potential,
   wherein two dummy word lines are respectively disposed on two sides of each of the word lines.

16. The memory device according to claim 15, wherein each word line group comprises two dummy word lines and one word line.

17. The memory device according to claim 15, wherein a portion of the word lines is contacted with a portion of the dummy word lines of the word line group.

* * * * *